United States Patent
Kitahara et al.

(10) Patent No.: US 6,557,143 B1
(45) Date of Patent: Apr. 29, 2003

(54) COMPUTER AIDED DESIGN SYSTEM AND COMPUTER-READABLE MEDIUM STORING A PROGRAM FOR DESIGNING CLOCK GATED LOGIC CIRCUITS AND GATED CLOCK CIRCUIT

(75) Inventors: Takeshi Kitahara, Kanagawa-ken (JP); Takashi Ishikawa, Kanagawa-ken (JP); Kimiyoshi Usami, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 101 days.

(21) Appl. No.: 09/661,437

(22) Filed: Sep. 13, 2000

(30) Foreign Application Priority Data

Sep. 14, 1999 (JP) ............................ 11-261014

(51) Int. Cl.$^7$ ................................................ G06F 17/50
(52) U.S. Cl. ............................................ 716/1; 716/6
(58) Field of Search ........................... 716/1, 6; 326/93

(56) References Cited

U.S. PATENT DOCUMENTS 6,020,774 A * 2/2000 Chiu et al. .................. 327/295
6,301,553 B1 * 10/2001 Burgun et al. ................. 703/15
6,351,170 B1 * 2/2002 Takahashi et al. ............ 327/198

OTHER PUBLICATIONS

U.S. patent application Ser. No. 09/168,961, Minami et al., filed Oct. 10, 1998.
U.S. patent application Ser. No. 09/052,363, Kitahara, filed Apr. 7, 1998.
Kitahara et al.; "A Clock–Gating Method for Low–Power LSI Design", Proceedings of ASP–DAC '98, pp. 307–312, (1998).
Schutz; "A 3.3 V 0.6$\mu$m BiCMOS Superscalar Microprocessor", 1994 IEEE International Solid–State Circuits Conference, pp. 202–203, (1994).

* cited by examiner

Primary Examiner—Matthew Smith
Assistant Examiner—Brandon Bowers
(74) Attorney, Agent, or Firm—Finnegan, Henderson, Farabow, Garrett & Dunner, L.L.P.

(57) ABSTRACT

A computer aided design system and a method for clock gated logic circuits, a computer-readable medium for storing the same and a gated clock circuit are provided in which the clock skew is suppressed within a tolerable level without increasing the electric power consumption.

3 Claims, 19 Drawing Sheets

|  | C0 | C1 | C2 | C3 | C4 | C5 | C6 | C7 | C8 | C9 |
|---|---|---|---|---|---|---|---|---|---|---|
| FREE | 39 | 159 | 214 | 316 | 52 | 228 | 611 | 220 | 13 | 87 |

|  | C0 | C1 | C2 | C3 | C4 | C5 | C6 | C7 | C8 | C9 | TOTAL |
|---|---|---|---|---|---|---|---|---|---|---|---|
| T0 |  |  |  |  |  |  |  |  |  |  |  |
| T1 |  |  |  |  |  |  |  |  |  |  |  |
| T2 |  |  |  |  |  |  |  |  |  |  |  |
| T3 |  |  |  |  |  |  |  |  |  |  |  |
| T4 |  |  |  |  |  |  |  |  |  |  |  |

ALLOC (NONE)

FIG.10(b)

|  | C0 | C1 | C2 | C3 | C4 | C5 | C6 | C7 | C8 | C9 |
|---|---|---|---|---|---|---|---|---|---|---|
| FREE | 39 | 159 | 214 | 316 | 52 | 228 | 223 | 220 | 13 | 87 |

|  | C0 | C1 | C2 | C3 | C4 | C5 | C6 | C7 | C8 | C9 | TOTAL |
|---|---|---|---|---|---|---|---|---|---|---|---|
| T0 |  |  |  |  |  |  | 388 |  |  |  | 388 |
| T1 |  |  |  |  |  |  |  |  |  |  |  |
| T2 |  |  |  |  |  |  |  |  |  |  |  |
| T3 |  |  |  |  |  |  |  |  |  |  |  |
| T4 |  |  |  |  |  |  |  |  |  |  |  |

ALLOC
1. C6-388→T0

FIG.10(c)

|  | C0 | C1 | C2 | C3 | C4 | C5 | C6 | C7 | C8 | C9 |
|---|---|---|---|---|---|---|---|---|---|---|
| FREE | 39 | 158 | 214 |  | 52 | 228 | 223 | 220 | 13 | 87 |

|  | C0 | C1 | C2 | C3 | C4 | C5 | C6 | C7 | C8 | C9 | TOTAL |
|---|---|---|---|---|---|---|---|---|---|---|---|
| T0 |  |  |  |  |  |  | 388 |  |  |  | 388 |
| T1 |  |  |  | 316 |  |  |  |  |  |  | 316 |
| T2 |  |  |  |  |  |  |  |  |  |  |  |
| T3 |  |  |  |  |  |  |  |  |  |  |  |
| T4 |  |  |  |  |  |  |  |  |  |  |  |

ALLOC
1. C6-388→T0
2. C3-316→T1

FIG.10(d)

|  | C0 | C1 | C2 | C3 | C4 | C5 | C6 | C7 | C8 | C9 |
|---|---|---|---|---|---|---|---|---|---|---|
| FREE | 39 | 169 | 214 |  | 52 | 158 | 223 | 220 | 13 | 87 |

|  | C0 | C1 | C2 | C3 | C4 | C5 | C6 | C7 | C8 | C9 | TOTAL |
|---|---|---|---|---|---|---|---|---|---|---|---|
| T0 |  |  |  |  |  |  | 388 |  |  |  | 388 |
| T1 |  |  |  | 316 |  | 72 |  |  |  |  | 388 |
| T2 |  |  |  |  |  |  |  |  |  |  |  |
| T3 |  |  |  |  |  |  |  |  |  |  |  |
| T4 |  |  |  |  |  |  |  |  |  |  |  |

ALLOC
1. C6-388→T0
2. C3-316→T1
3. C5-72→T1

FIG.10(e)

| | C0 | C1 | C2 | C3 | C4 | C5 | C6 | C7 | C8 | C9 | TOTAL |
|---|---|---|---|---|---|---|---|---|---|---|---|
| FREE | 39 | 159 | 214 | | 52 | 156 | | 220 | 13 | 87 | |
| T0 | | | | | | | 388 | | | | 388 |
| T1 | | | | 316 | | 72 | ↓ | | | | 388 |
| T2 | | | | | | | 223 | | | | 223 |
| T3 | | | | | | | | | | | |
| T4 | | | | | | | | | | | |

ALLOC
1. C6-388→T0
2. C3-316→T1
3. C5-72→T1
4. C6-223→T2

FIG.10(f)

| | C0 | C1 | C2 | C3 | C4 | C5 | C6 | C7 | C8 | C9 | TOTAL |
|---|---|---|---|---|---|---|---|---|---|---|---|
| FREE | 39 | 159 | 214 | | 52 | 156 | | 55 | 13 | 87 | |
| T0 | | | | | | | 388 | | | | 388 |
| T1 | | | | 316 | | 72 | | ↓ | | | 388 |
| T2 | | | | | | | 223 | 165 | | | 388 |
| T3 | | | | | | | | | | | |
| T4 | | | | | | | | | | | |

ALLOC
1. C6-388→T0
2. C3-316→T1
3. C5-72→T1
4. C6-223→T2
5. C7-165→T2

FIG.10(g)

| | C0 | C1 | C2 | C3 | C4 | C5 | C6 | C7 | C8 | C9 | TOTAL |
|---|---|---|---|---|---|---|---|---|---|---|---|
| FREE | 39 | 159 | | | 52 | 156 | | 55 | 13 | 87 | |
| T0 | | | | | | | 388 | | | | 388 |
| T1 | | | | 316 | | 72 | | | | | 388 |
| T2 | | | | | | | 223 | 165 | | | 388 |
| T3 | | | 214 | | | | | | | | 214 |
| T4 | | | | | | | | | | | |

ALLOC
1. C6-388→T0
2. C3-316→T1
3. C5-72→T1
4. C6-223→T2
5. C7-165→T2
6. C2-214→T3

FIG.10(h)

| | C0 | C1 | C2 | C3 | C4 | C5 | C6 | C7 | C8 | C9 | TOTAL |
|---|---|---|---|---|---|---|---|---|---|---|---|
| FREE | 39 | | | | 52 | 156 | | 55 | 13 | 87 | |
| T0 | | | | | | | 388 | | | | 388 |
| T1 | | | | 316 | | 72 | | | | | 388 |
| T2 | | | | | | | 223 | 185 | | | 388 |
| T3 | | 159 | 214 | | | | | | | | 373 |
| T4 | | | | | | | | | | | |

ALLOC
1. C6-388→T0
2. C3-316→T1
3. C5-72→T1
4. C6-223→T2
5. C7-165→T2
6. C2-214→T3
7. C1-159→T3

FIG.10(i)

| | C0 | C1 | C2 | C3 | C4 | C5 | C6 | C7 | C8 | C9 | |
|---|---|---|---|---|---|---|---|---|---|---|---|
| FREE | 39 | | | | 52 | 141 | | 55 | 13 | 87 | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | | | | | | | | | | | |
| | C0 | C1 | C2 | C3 | C4 | C5 | C6 | C7 | C8 | C9 | TOTAL |

ALLOC
1. C6-388→T0
2. C3-316→T1
3. C5-72→T1
4. C6-223→T2
5. C7-165→T2
6. C2-214→T3
7. C1-159→T3
8. C5-15→T3

FIG.10(j)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | 87 | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | | | | | | 141 | | | | | 141 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
7. C1-159→T3
8. C5-15→T3
9. C5-141→T4

FIG.10(k)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 16 | | | | | 388 |
| T4 | | | | | | 141 | | | | 87 | 228 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
8. C5-15→T3
9. C5-141→T4
10. C9-87→T4

FIG.10(l)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | | 13 | | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | | | | | | 141 | | 55 | | 87 | 283 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
9. C5-141→T4
10. C9-87→T4
11. C7-55→T4

FIG.10(m)

| | C0 | C1 | C2 | C3 | C4 | C5 | C6 | C7 | C8 | C9 | |
|---|---|---|---|---|---|---|---|---|---|---|---|
| FREE | 39 | | | | | | | | 13 | | |
| T0 | | | | | | | 388 | | | | 388 |
| T1 | | | | 316 | 72 | | | | | | 388 |
| T2 | | | | | | 223 | 165 | | | | 388 |
| T3 | | 159 | 214 | | 15 | | | | | | 388 |
| T4 | | | | | 52 | 141 | | 55 | | 87 | 335 |
| | C0 | C1 | C2 | C3 | C4 | C5 | C6 | C7 | C8 | C9 | TOTAL |

ALLOC
| 1 | C6-388→T0 |
| 2 | C3-316→T1 |
| 3 | C5-72→T1 |
| ⋮ | |
| 10 | C9-87→T4 |
| 11 | C7-55→T4 |
| 12 | C4-52→T4 |

FIG.10(n)

| | C0 | C1 | C2 | C3 | C4 | C5 | C6 | C7 | C8 | C9 | |
|---|---|---|---|---|---|---|---|---|---|---|---|
| FREE | | | | | | | | | 13 | | |
| T0 | | | | | | | 388 | | | | 388 |
| T1 | | | | 316 | 72 | | | | | | 388 |
| T2 | | | | | | 223 | 165 | | | | 388 |
| T3 | | 159 | 214 | | 15 | | | | | | 388 |
| T4 | 39 | | | | 52 | 141 | | 55 | | 87 | 374 |
| | C0 | C1 | C2 | C3 | C4 | C5 | C6 | C7 | C8 | C9 | TOTAL |

ALLOC
| 1 | C6-388→T0 |
| 2 | C3-316→T1 |
| 3 | C5-72→T1 |
| ⋮ | |
| 11 | C7-55→T4 |
| 12 | C4-52→T4 |
| 13 | C0-39→T4 |

FIG.10(o)

| | C0 | C1 | C2 | C3 | C4 | C5 | C6 | C7 | C8 | C9 | |
|---|---|---|---|---|---|---|---|---|---|---|---|
| FREE | | | | | | | | | | | |
| T0 | | | | | | | 388 | | | | 388 |
| T1 | | | | 316 | 72 | | | | | | 388 |
| T2 | | | | | | 223 | 165 | | | | 388 |
| T3 | | 159 | 214 | | 15 | | | | | | 388 |
| T4 | 39 | | | | 52 | 141 | | 55 | 13 | 87 | 387 |
| | C0 | C1 | C2 | C3 | C4 | C5 | C6 | C7 | C8 | C9 | TOTAL |

ALLOC
| 1 | C6-388→T0 |
| 2 | C3-316→T1 |
| 3 | C5-72→T1 |
| ⋮ | |
| 12 | C4-52→T4 |
| 13 | C0-39→T4 |
| 14 | C8-13→T4 |

FIG.12(a)

| | C0 | C1 | C2 | C3 | C4 | C5 | C6 | C7 | C8 | C9 | |
|---|---|---|---|---|---|---|---|---|---|---|---|
| FREE | | | | | | | | | | | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | 39 | | | | 52 | 141 | | 55 | 13 | 87 | 387 |

ALLOC
| | |
|---|---|
| 1 | C6-388→T0 |
| 2 | C3-316→T1 |
| 3 | C5-72→T1 |
| ⋮ | |
| 12 | C4-52→T4 |
| 13 | C0-39→T4 |
| 14 | C8-13→T4 |

FIG.12(b)

| | C0 | C1 | C2 | C3 | C4 | C5 | C6 | C7 | C8 | C9 |
|---|---|---|---|---|---|---|---|---|---|---|
| FREE | | | | | | | | | 13 | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | 39 | | | | 52 | 141 | | 55 | | 87 | 374 |

ALLOC
| | |
|---|---|
| 1 | C6-388→T0 |
| 2 | C3-316→T1 |
| 3 | C5-72→T1 |
| ⋮ | |
| 11 | C7-55→T4 |
| 12 | C4-52→T4 |
| 13 | C0-39→T4 |

FIG.12(c)

| | C0 | C1 | C2 | C3 | C4 | C5 | C6 | C7 | C8 | C9 |
|---|---|---|---|---|---|---|---|---|---|---|
| FREE | 39 | | | | | | | | 13 | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | | | | | 52 | 141 | | 55 | | 87 | 335 |

ALLOC
| | |
|---|---|
| 1 | C6-388→T0 |
| 2 | C3-316→T1 |
| 3 | C5-72→T1 |
| ⋮ | |
| 10 | C9-87→T4 |
| 11 | C7-55→T4 |
| 12 | C4-52→T4 |

FIG.12(d)

| | C0 | C1 | C2 | C3 | C4 | C5 | C6 | C7 | C8 | C9 |
|---|---|---|---|---|---|---|---|---|---|---|
| FREE | 39 | | | | 52 | | | | 13 | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | 15 | | | | | 388 |
| T4 | | | | | | 141 | | 55 | | 87 | 283 |

ALLOC
| | |
|---|---|
| 1 | C6-388→T0 |
| 2 | C3-316→T1 |
| 3 | C5-72→T1 |
| ⋮ | |
| 9 | C5-141→T4 |
| 10 | C9-87→T4 |
| 11 | C7-55→T4 |

FIG.12(e)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | | |
| T0 | | | | | | | 388 | | | | 388 |
| T1 | | | | 316 | | 72 | | | | | 388 |
| T2 | | | | | | | | 223 | 165 | | 388 |
| T3 | | 159 | 214 | | | 15 | | | | | 388 |
| T4 | | | | | | 141 | | | | 87 | 228 |
| | C0 | C1 | C2 | C3 | C4 | C5 | C6 | C7 | C8 | C9 | TOTAL |

ALLOC
1. C6-388→T0
2. C3-316→T1
3. C5-72→T1
   ⋮
8. C5-15→T3
9. C5-141→T4
10. C9-87→T4

FIG.12(f)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | 87 | |
| T0 | | | | | | | 388 | | | | 388 |
| T1 | | | | 316 | | 72 | | | | | 388 |
| T2 | | | | | | | | 223 | 165 | | 388 |
| T3 | | 159 | 214 | | | 15 | | | | | 388 |
| T4 | | | | | | 141 | | | | | 141 |
| | C0 | C1 | C2 | C3 | C4 | C5 | C6 | C7 | C8 | C9 | TOTAL |

ALLOC
1. C6-388→T0
2. C3-316→T1
3. C5-72→T1
   ⋮
7. C1-159→T3
8. C5-15→T3
9. C5-141→T4

FIG.12(g)

| | C0 | C1 | C2 | C3 | C4 | C5 | C6 | C7 | C8 | C9 | |
|---|---|---|---|---|---|---|---|---|---|---|---|
| FREE | 39 | | | | 52 | 141 | | 55 | 13 | 87 | |
| T0 | | | | | | | 388 | | | | 388 |
| T1 | | | | 316 | | 72 | | | | | 388 |
| T2 | | | | | | | | 223 | 165 | | 388 |
| T3 | | 159 | 214 | | | 15 | | | | | 388 |
| T4 | | | | | | | | | | | |
| | C0 | C1 | C2 | C3 | C4 | C5 | C6 | C7 | C8 | C9 | TOTAL |

ALLOC
1. C6-388→T0
2. C3-316→T1
3. C5-72→T1
4. C6-223→T2
5. C7-165→T2
6. C2-214→T3
7. C1-159→T3
8. C5-15→T3

FIG.12(h)

| | C0 | C1 | C2 | C3 | C4 | C5 | C6 | C7 | C8 | C9 | |
|---|---|---|---|---|---|---|---|---|---|---|---|
| FREE | 39 | | | | 52 | 156 | | 55 | 13 | 87 | |
| T0 | | | | | | | 388 | | | | 388 |
| T1 | | | | 316 | | 72 | | | | | 388 |
| T2 | | | | | | | | 223 | 165 | | 388 |
| T3 | | 159 | 214 | | | | | | | | 373 |
| T4 | | | | | | | | | | | |
| | C0 | C1 | C2 | C3 | C4 | C5 | C6 | C7 | C8 | C9 | TOTAL |

ALLOC
1. C6-388→T0
2. C3-316→T1
3. C5-72→T1
4. C6-223→T2
5. C7-165→T2
6. C2-214→T3
7. C1-159→T3

FIG.12(i)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | 87 | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | | 373 |
| T4 | | | | | | 156 | | | | | 156 |
| | C0 | C1 | C2 | C3 | C4 | C5 | C6 | C7 | C8 | C9 | TOTAL |

ALLOC
1. C6-388→T0
2. C3-316→T1
3. C5-72→T1
4. C6-223→T2
5. C7-165→T2
6. C2-214→T3
7. C1-159→T3
8. C5-156→T4

FIG.12(j)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | 72 | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | | | | | | 156 | | | | | 156 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
7. C1-159→T3
8. C5-156→T4
9. C9-15→T3

FIG.12(k)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | 55 | 13 | | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | | | | | | 156 | | | | 72 | 228 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
8. C5-156→T4
9. C9-15→T3
10. C9-72→T4

FIG.12(l)

| | C0 | C1 | C2 | C3 | C4 | C5 | C6 | C7 | C8 | C9 | |
|---|---|---|---|---|---|---|---|---|---|---|---|
| FREE | 39 | | | | 52 | | | | 13 | | |
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | | | | | | 156 | | 55 | | 72 | 283 |
| | C0 | C1 | C2 | C3 | C4 | C5 | C6 | C7 | C8 | C9 | TOTAL |

ALLOC
1. C6-388→T0
2. C3-316→T1
3. C5-72→T1
⋮
9. C9-15→T3
10. C9-72→T4
11. C7-55→T4

FIG.12(m)

| | C0 | C1 | C2 | C3 | C4 | C5 | C6 | C7 | C8 | C9 |
|---|---|---|---|---|---|---|---|---|---|---|
| FREE | 38 | | | | | | | | 13 | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | | | | | 52 | 156 | | 55 | | 72 | 335 |

ALLOC:
1. C6-388→T0
2. C3-316→T1
3. C5-72→T1
⋮
10. C9-72→T4
11. C7-55→T4
12. C4-52→T4

FIG.12(n)

| | C0 | C1 | C2 | C3 | C4 | C5 | C6 | C7 | C8 | C9 |
|---|---|---|---|---|---|---|---|---|---|---|
| FREE | | | | | | | | | 13 | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | 39 | | | | 52 | 156 | | 55 | | 72 | 374 |

ALLOC:
1. C6-388→T0
2. C3-316→T1
3. C5-72→T1
⋮
11. C7-55→T4
12. C4-52→T4
13. C0-39→T4

FIG.12(o)

| | C0 | C1 | C2 | C3 | C4 | C5 | C6 | C7 | C8 | C9 |
|---|---|---|---|---|---|---|---|---|---|---|
| FREE | | | | | | | | | | |

| | C0 | C1 | C2 | C3 | C4 | C5 | C6 | C7 | C8 | C9 | TOTAL |
|---|---|---|---|---|---|---|---|---|---|---|---|
| T0 | | | | | | | 388 | | | | 388 |
| T1 | | | | 316 | | 72 | | | | | 388 |
| T2 | | | | | | | 223 | 165 | | | 388 |
| T3 | | 159 | 214 | | | | | | | 15 | 388 |
| T4 | 39 | | | | 52 | 156 | | 55 | 13 | 72 | 387 |

ALLOC:
1. C6-388→T0
2. C3-316→T1
3. C5-72→T1
⋮
12. C4-52→T4
13. C0-39→T4
14. C8-13→T4

COMPUTER AIDED DESIGN SYSTEM AND COMPUTER-READABLE MEDIUM STORING A PROGRAM FOR DESIGNING CLOCK GATED LOGIC CIRCUITS AND GATED CLOCK CIRCUIT

CROSS REFERENCE TO RELATED APPLICATIONS

The subject application is related to subject matter disclosed in the Japanese Patent Application No.Hei11-261014 filed in Sep. 14, 1999 in Japan, to which the subject application claims priority under the Paris Convention and which is incorporated by reference herein.

BACKGROUND OF THE INVENTION

1. Field of the Invention

The present invention is related to a gated clock design technique by the use of a computer, and more particularly related to a computer aided design system for clock gated logic circuits, a computer-readable medium for storing the program of the system and a gated clock circuit.

2. Prior Art

In recent years, the frequencies of the clock signal for driving LSIs have been dramatically increased to require much power consumption.

The gated clock design technique has been developed for the purpose of obtaining the logic circuit designs with low electric power consumption. The procedure of modifying logic circuits by means of the gated clock design technique is called as "clock gating" in the following explanation.

FIG. 1(a) is a circuit diagram showing a clocked logic circuit with a clock tree structure which has not been clock gated. In the followings, registers to be controlled under the same register transfer condition (the same enable logic) are grouped into a set which is called a "cluster" for the sake of explanation. Also, in this example, there are ten register transfer conditions. Each register is subjected to one of the register transfer conditions and belongs to a corresponding one of the ten clusters C0 to C9.

Since the circuit as illustrated in FIG. 1(a) is not designed in the clock gating structure, the clock signal CLK is supplied to all the clusters through the clock tree structure T in which the load is distributed uniformly. It is possible therefore to minimize the clock skew and therefore to finish the designing and developing process of an error free circuit in a short time within the schedule.

However, in the recent years, since the frequency of the clock signal CLK has been dramatically increased to require much power consumption so that the increase of the electric power consumption becomes problematic in the case of the logic circuit as illustrated in FIG. 1(a). Furthermore, as illustrated in FIG. 1(b) which is a circuit diagram showing one register circuit for use in the clock tree structure of the clocked logic circuit which has not been clock gated, a feedback loop including a multiplexer 22 has to be provided for each register circuit in order to keep the current value in the register 21 when the register transfer condition is not satisfied. In this case, since the clock signal CLK is supplied always to all the register circuits to drive the entirety of the clock tree structure, the electric power consumption becomes significantly increased.

Because of this, such a circuit as described above is quite inappropriate to be applied for electric appliances powered by batteries such as mobile gears which are driven for short times after charging. It is therefore required to reduce the electric power consumption of the circuit.

In usual cases, it is believed effective to reduce the electric power consumption of the clock supply system for the purpose of reducing the electric power consumption of an LSI chip. The clock gating technique has been known as a most effective technique to reduce the electric power consumption of the clock supply system.

FIG. 2(a) is a circuit diagram showing an exemplary configuration of the clock tree structure of a gated clock logic circuit in accordance with a conventional technique. Register circuits belong to ten clusters and then belong respectively to ten partial trees T0 to T9, to which a clock signal CLK is supplied through AND gate circuits G0 to G9 provided for clock gating. The clock signal CLK is supplied to the AND gate circuits G0 to G9 through a buffer circuit 1.

For example, since the register transfer condition En(C6) is input to one input terminal of the AND gate circuit G6, the clock signal CLK is supplied to the partial tree T6 when this register transfer condition (i.e. En(C6)=1) is satisfied while the clock signal CLK is not supplied to the partial tree T6 when this register transfer condition is not satisfied (i.e. En(C6)=0).

In this case, since there are 611 register circuits belonging to the cluster C6 to which the clock signal CLK is supplied only when the register transfer condition is satisfied, it is possible to keep the current value in the register 21 when the register transfer condition is not satisfied even if there is provided no feedback loop for the register circuit 2 as illustrated in FIG. 2(b) resulting in a simplified circuit design.

Namely, in the case of the gated clock logic circuit in accordance with the conventional technique as illustrated in FIG. 2(a), since clock signal CLK is supplied to the register circuits only when the register transfer condition is satisfied, there is no need for the feedback loops to keep the current values in the registers as illustrated in FIG. 1(b) when the register transfer condition is not satisfied so as to reduce the unnecessary clock pluses of supplying the clock signal to the register circuits, the unnecessary clock pluses of driving the clock tree structure and therefore the electric power consumption thereof.

However, the clock tree structure is composed of the combination of the partial trees for the respective clusters which have different numbers of the register circuits belonging thereto. For example, the differential number between the constituent register circuits of the partial tree T0 and the partial tree T6 is significant, i.e., 572, and therefore it is difficult to keep the clock skew within a tolerable range. As a result, when the skew is substantial, there is a problem that the risk of device malfunctions is increased to require the designer to begin his work again so as to elongate the designing and development time.

SUMMARY OF THE INVENTION

The present invention has been made in order to solve the shortcomings as described above. It is an object of the present invention to provide a receiver/transmitter apparatus which can be manufactured in massproduction at a low cost.

In brief, the above and other objects and advantages of the present invention are provided by a new and improved gated clock circuit comprising:

a plurality of storage elements which are grouped into a plurality of partial trees;

a plurality of gating circuits provided respectively for said partial trees in order to control the supply of a clock signal to each of said partial trees respectively in accordance with the logic sum of the enable logics of those of said storage elements belonging to said each of said partial trees, wherein at least one of said partial trees has at least one of said storage elements having a feedback loop and at least one of said storage elements having no feedback loop.

In a preferred embodiment, further improvement resides in that said storage elements are grouped into the plurality of partial trees in order that the disparity in the numbers of said storage elements belonging to said partial trees is no higher than 5%.

In a preferred embodiment, further improvement resides in that said storage elements are register circuits consisting of flip-flops.

In a preferred embodiment, further improvement resides in that said feedback loop is composed of a multiplexer for selecting either of the output signal of said register circuit and the external input signal and outputting the signal as selected to said register circuit in accordance with the enable logic of the group including the storage element having that feedback loop.

In accordance with a further aspect of the present invention, the above and other objects and advantages of the present invention are provided by a new and improved computer aided design system for clock gated logic circuits consisting of a plurality of storage elements, said system comprising:

a circuit information storing section for storing information about a clock gated logic circuit under the design;

a storage element allocation section for allocating said storage elements to a plurality of partial trees on the basis of said information about a clock gated logic circuit said gated clock circuit under the design;

an output section for outputting clock tree structure information with gating logics under the design on the basis of said partial trees consisting of said storage elements as allocated by said storage element allocation section;

wherein at least one of said partial trees has at least one of said storage elements having a feedback loop and at least one of said storage elements having no feedback loop.

In a preferred embodiment, further improvement resides in that said circuit information storing section serves to store clock tree structure information without gating logics as said information about the clock gated logic circuit under the design.

In a preferred embodiment, further improvement resides in that said storage elements are allocated to the plurality of partial trees in order that the disparity in the numbers of said storage elements belonging to said partial trees is no higher than 5%.

In a preferred embodiment, further improvement resides in that said gating logics are provided to control the supply of the clock signal to said partial trees in accordance with the logic sum of the enable logics of those of said storage elements belonging to said each of said partial trees.

In a preferred embodiment, further improvement resides in that, while said storage element allocation section serves to generate a plurality of allocation patterns according to each of which said storage element are allocated to said partial trees in a different manner, said output section serves to output one of said allocation patterns taking into consideration the electric power consumption of the gated clock circuit as constructed in accordance with each allocation pattern.

In accordance with a further aspect of the present invention, the above and other objects and advantages of the present invention are provided by a new and improved computer program embodied on a computer-readable medium for designing clock gated logic circuits, said program comprising:

a step of obtaining information about a clock gated logic circuit under the design;

a step of allocating said storage elements to a plurality of partial trees on the basis of said information about a clock gated logic circuit said gated clock circuit under the design;

a step of outputting clock tree structure information with gating logics under the design on the basis of said partial trees consisting of said storage elements as allocated by said allocating step, wherein at least one of said partial trees has at least one of said storage elements having a feedback loop and at least one of said storage elements having no feedback loop.

In a preferred embodiment, further improvement resides in that said information about the clock gated logic circuit under the design includes clock tree structure information without gating logics.

In a preferred embodiment, further improvement resides in that said storage elements are allocated to the plurality of partial trees in order that the disparity in the numbers of said storage elements belonging to said partial trees is no higher than 5%.

In a preferred embodiment, further improvement resides in that said gating logics are provided to control the supply of the clock signal to said partial trees in accordance with the logic sum of the enable logics of those of said storage elements belonging to said each of said partial trees.

In a preferred embodiment, further improvement resides in that, while a plurality of allocation patterns are generated, according to each of which patterns said storage element are allocated to said partial trees in a different manner, one of said allocation patterns is selectively output, taking into consideration the electric power consumption of the gated clock circuit as constructed in accordance with each allocation pattern.

BRIEF DESCRIPTION OF DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 10(a) through FIG. 10(o) are tables illustrating the sequence of obtaining the first allocation pattern by means of the register allocation section as illustrated in FIG. 5.

FIG. 12(a) through FIG. 10(o) are tables illustrating the sequence of obtaining the subsequent allocation pattern by means of the register allocation section as illustrated in FIG. 5.

DETAILED DESCRIPTION OF EMBODIMENTS

Figure 1:
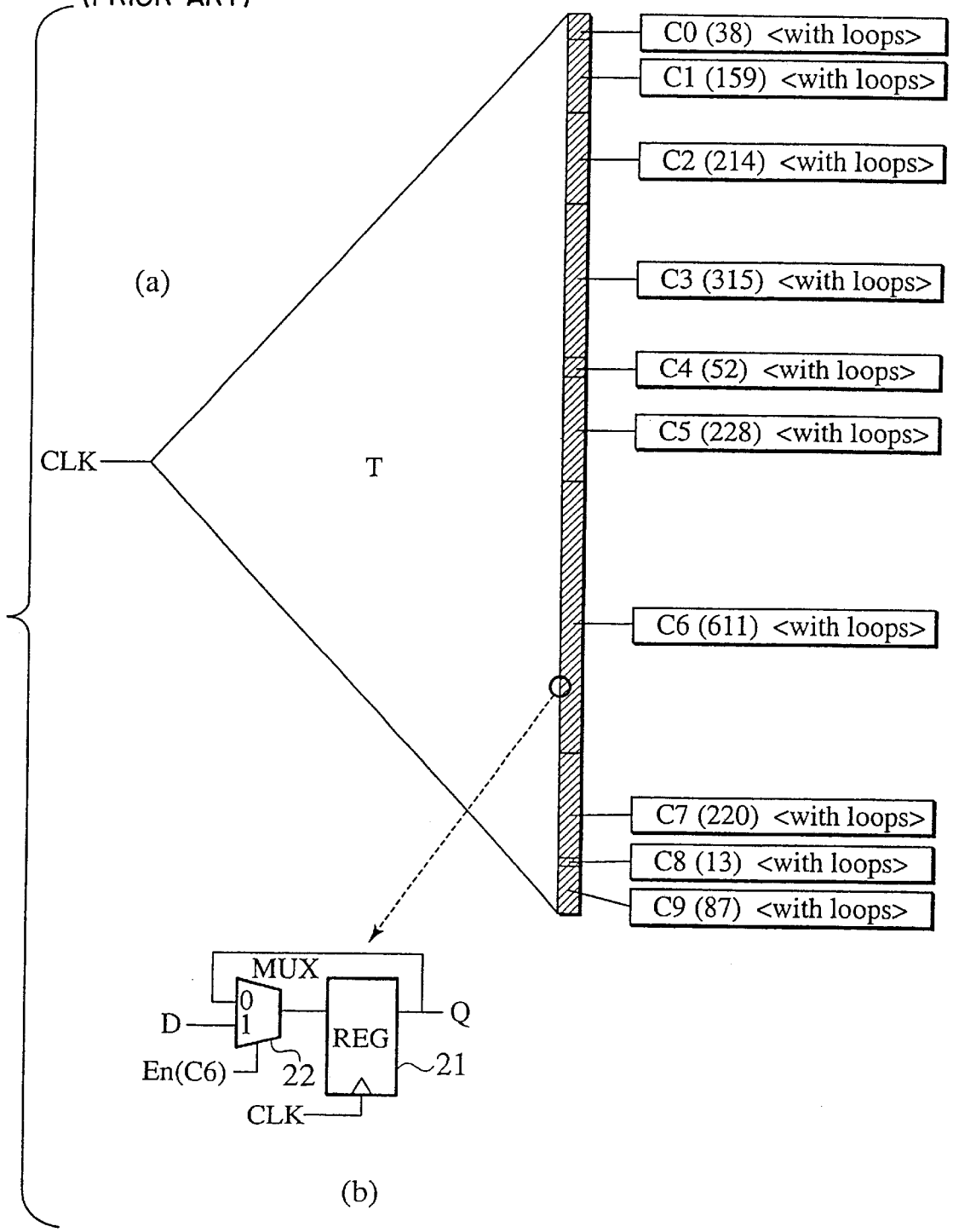
FIG. 1(a) is a circuit diagram showing a clocked logic circuit with a clock tree structure which has not been clock gated.
FIG. 1(b) is a circuit diagram showing one register circuit for use in the clock tree structure of the clocked logic circuit as illustrated in FIG. 1(a).
Figure 2:
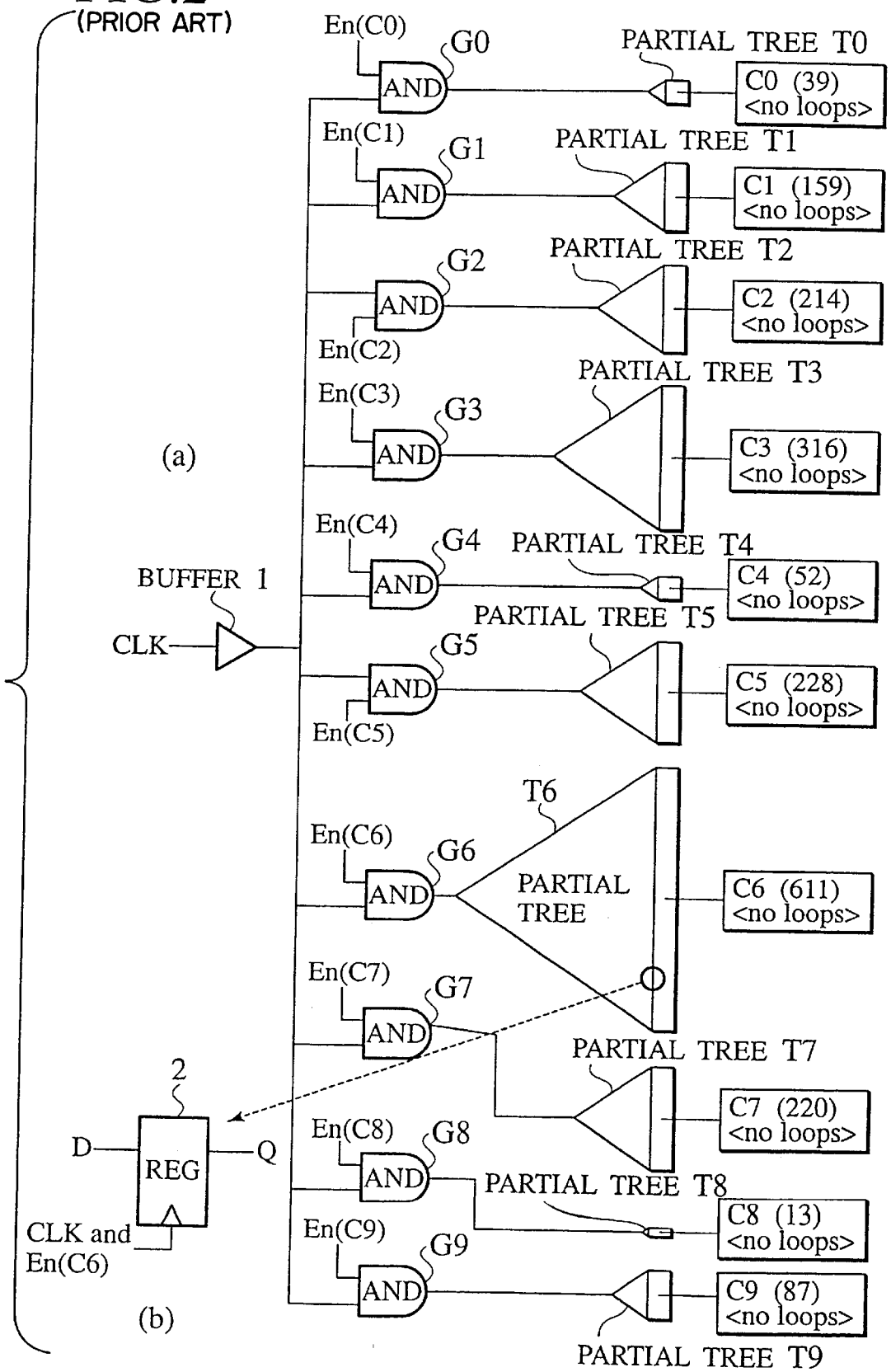
FIG. 2(a) is a circuit diagram showing an exemplary configuration of the clock tree structure of a gated clock logic circuit in accordance with a conventional technique.
FIG. 2(b) is a circuit diagram showing one register circuit for use in the clock tree structure of the clocked logic circuit as illustrated in FIG. 2(a).
Figure 3:
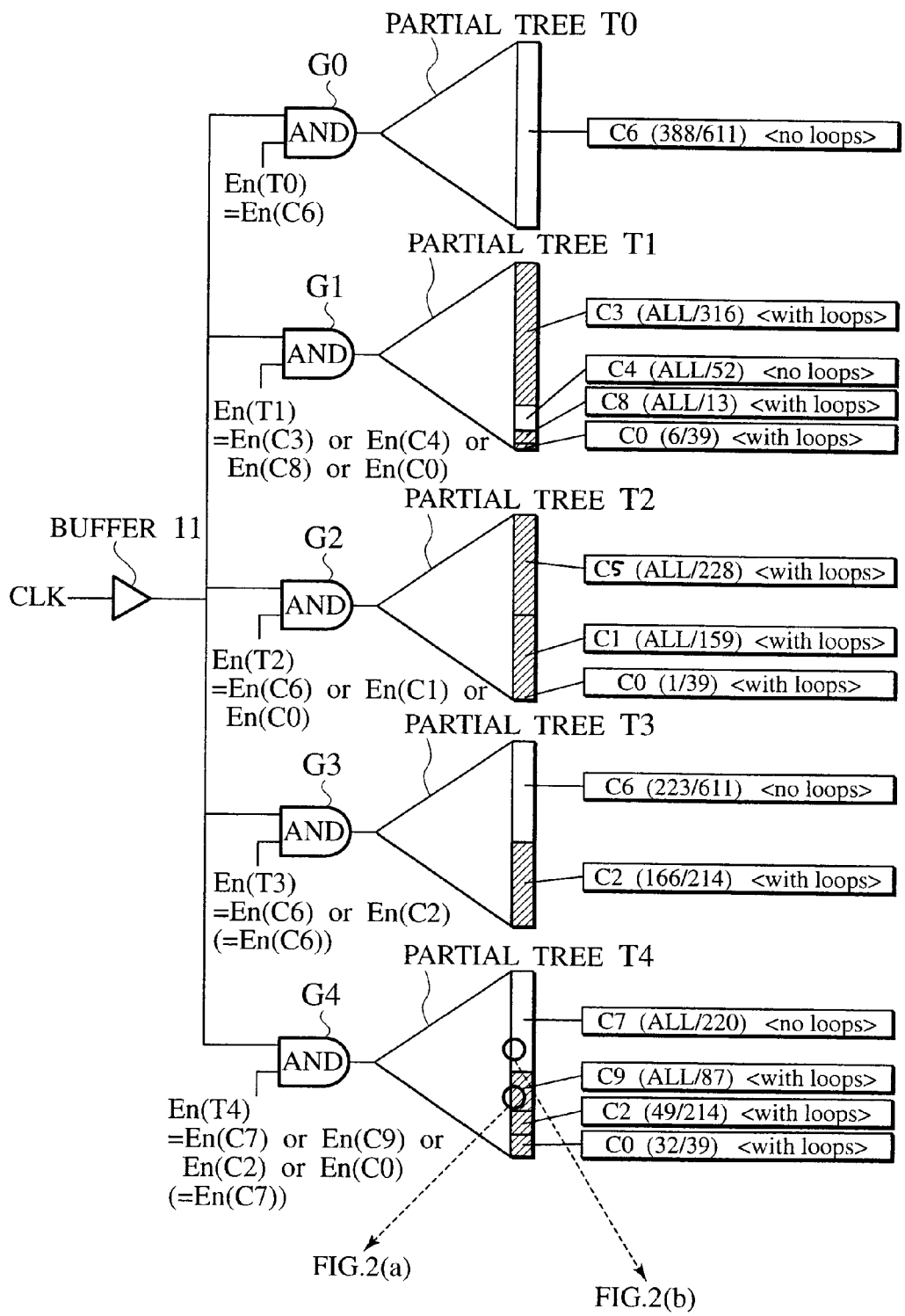
FIG. 3 is a circuit diagram showing the configuration of the clock tree structure of a gated clock circuit in accordance with an embodiment of the present invention.

Hereinbelow, several preferred embodiments in accordance with the present invention will be explained in conjunction with the accompanied drawings. FIG. 3 is a circuit diagram showing the configuration of the clock tree structure of a gated clock circuit in accordance with an embodiment of the present invention.

The gated clock circuit is composed of a buffer circuit 11 for receiving a clock signal CLK, AND gate circuits G0 to G4 for gating the clock signal CLK as supplied from the buffer circuit 11 in accordance with enable logics (gating conditions), and partial trees T0 to T4 to which the clock signal CLK is supplied through the AND gate circuits G0 to G4. Each of the partial trees T0 to T4 is composed of a plurality of register circuits comprising flip-flops.

Figure 4:
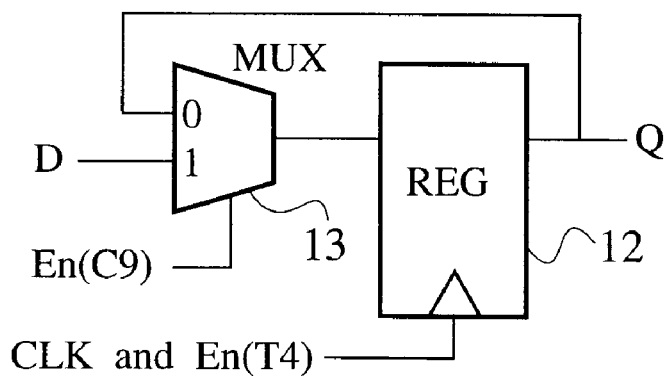
FIG. 4(a) and FIG. 4(b) are circuit diagrams showing two types of the register circuits of the partial trees as illustrated in FIG. 3
Figure 4:
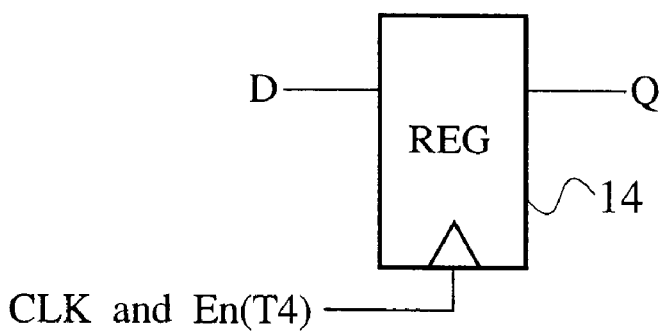

FIG. 4(a) and FIG. 4(b) are circuit diagrams showing two types of the register circuits of the partial trees as illustrated in FIG. 3. One type as illustrated is a register circuit having a feedback loop with a multiplexer 13 for selecting either of the output of a register 12 and the external input signal. When the current value is to be kept, the output of the register 12 is selected.

The other register circuit as illustrated in FIG. 4(b) is not provided with the feedback loop. Namely, the register circuit is composed of a register 14 alone. When the current value is to be kept, the supply of the clock signal CLK to the register 14 is halted.

Next, the operation of the clock gating technique in accordance with this embodiment of the present invention will be explained. The clock tree structure is composed of the combination of five partial trees T0 to T4 each of which consists of an approximately same number of the register circuits, i.e., 388 or 387. In the followings, it is assumed that the capacitance values of the respective register circuits are equal to each other for the sake of clarity in explanation.

The clock signal CLK is inputted to one of the input terminals of each of the AND gate circuits G0 to G4 through the buffer circuit 11. The other input terminals of the AND gate circuits G0 to G4 are given enable signals En(T0) to En(T4) respectively. Accordingly, when either enable logic is true, i.e., when the corresponding enable signal is given, the clock signal CLK is supplied to a corresponding one of the partial tree T0 to T4. Meanwhile, when the AND gate circuits G0 to G4 are used for gating, each enable logic is constructed as the logic sum of the register transfer conditions of the register groups, each of which is composed of the register circuits belonging to that partial tree and belonging to one cluster, i.e., the logic sum of the register transfer conditions of the pertinent clusters, in order to generate the enable signal.

For example, since the partial tree T2 is composed of the clusters C5, C1 and C0, the corresponding enable signal is generated as the logic sum of the respective register transfer conditions of the register circuits belonging to the clusters, i.e., En(T2)=En(C5) or En(C1) or En(C0).

A feedback loop has to be provided for the register groups belonging to a partial tree and belonging to a cluster which has a register transfer condition different than the enable signal of that partial tree, as illustrated in FIG. 4(a), in order to keep the current value of the register circuits when the register transfer condition is not satisfied. However, a feedback loop is not necessary for the register groups belonging to a partial tree and belonging to a cluster which has a register transfer condition same as the enable signal of the partial tree in question, as illustrated in FIG. 4(b), since the partial tree in question is not driven when the register transfer condition is not satisfied.

In accordance with this embodiment of the present invention, the gated clock logic circuit is composed of the clock tree structure with a plurality of the partial trees having approximately same numbers of the register circuits, i.e., the capacitance values of the respective partial trees are approximately equal to each other so that the skew of the gated clock logic circuit can be suppressed. Accordingly, there is little possibility of occurring any malfunction due to the skew so that it is possible to finish the designing and developing process of an error free circuit in a short time.

Also, when all the register transfer conditions of the register groups belonging to a partial tree is not satisfied, the supply of the clock signal to that partial tree is halted so that the electric power consumption can be reduced.

Alternatively, there are similar effects and advantages also in the case that the register circuits are assigned respectively to the partial trees T0 to T4 in order to make equal the total capacitance values of the register circuits belonging to the respective partial trees T0 to T4 rather than by making equal the numbers of the register circuits belonging to the respective partial trees T0 to T4.

Also, while the logic circuits for gating are composed respectively of AND gate circuits in the case of the embodiment as described above, they can be composed of OR gate circuits or other appropriate logic circuits. Furthermore, while each register is composed of a flip-flop in the case of the embodiment as described above, another appropriate storage element can be used for the same purpose.

In the case that the OR gate circuits are used for gating, the enable signal is generated by the logic product of the register transfer conditions the inversion of said logic value of the register circuits assigned to the partial tree in question.

Figure 5:
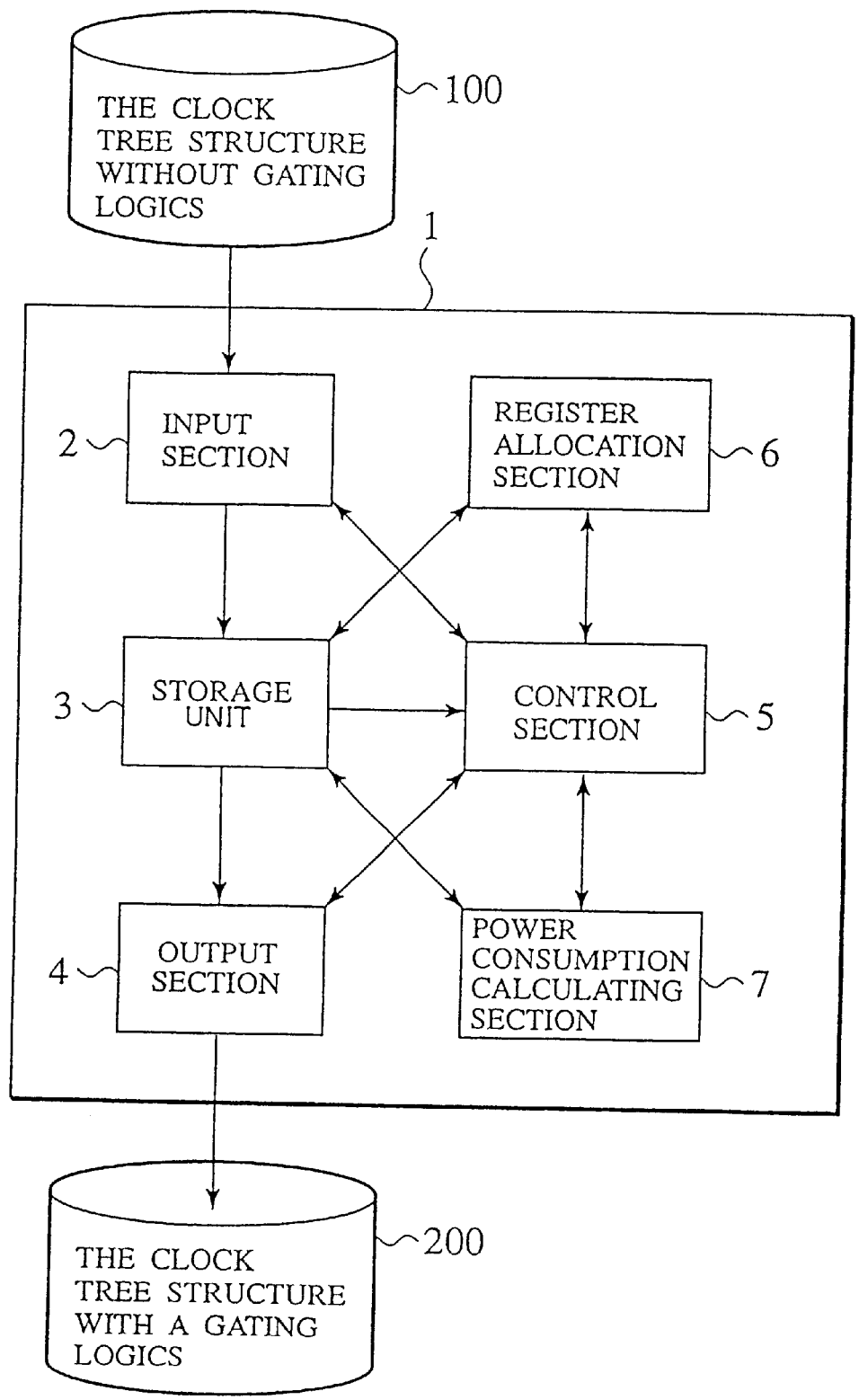
FIG. 5 is a block diagram showing a computer aided design system and method for the gated clock circuit in accordance with an embodiment of the present invention.

FIG. 5 is a block diagram showing a computer aided design system and method for the gated clock circuit in accordance with an embodiment of the present invention. The computer aided design system 1 for clock gated logic circuits is provided to aid circuit designers in designing a gated clock circuit as illustrated in FIG. 3.

The computer aided design system for clock gated logic circuits 1 is composed of an input section 2 for inputting clock tree structure information 100 without gating logics; a storage unit 3 for storing clock tree structure information 100 without gating logics; clock tree structure information 200 with gating logics and the result of calculating the optimal patterns for allocating register circuits to the respective partial trees; an output section 4 for outputting the clock tree structure information 200 with gating logics; a control section 5 for controlling the design aid of gated clock circuits; a register allocation section 6 for allocating register circuits to the respective partial trees; and an electric power consumption calculating section 7 for calculating the electric power consumption of the gated clock circuit.

Next, the operation of this embodiment of the present invention will be explained. Firstly, the outline of the operation of the gated clock circuit will be briefly explained. Namely, the control section 5 serves to store the clock tree structure information 100 without gating logics in the storage unit 3 through the input section 2. The control section 5 also serves to control the register allocation section 6 to obtain the patterns for allocating register groups to the respective partial trees on the basis of the clock tree structure information without gating logics as stored in the storage unit 3, and serves to control the electric power consumption calculating section 7 to calculate the electric power consumption of the allocation patterns.

By this configuration, the optimal patterns for allocating register groups to the respective partial trees are determined and are stored in the storage unit 3. The calculation result as stored is output as the clock tree structure information 200 with gating logics through the output section 4. Meanwhile, the computer aided design system for clock gated logic circuits 1 can be used alone, and also can be used by incorporating the system in place and route tools.

Figure 6:
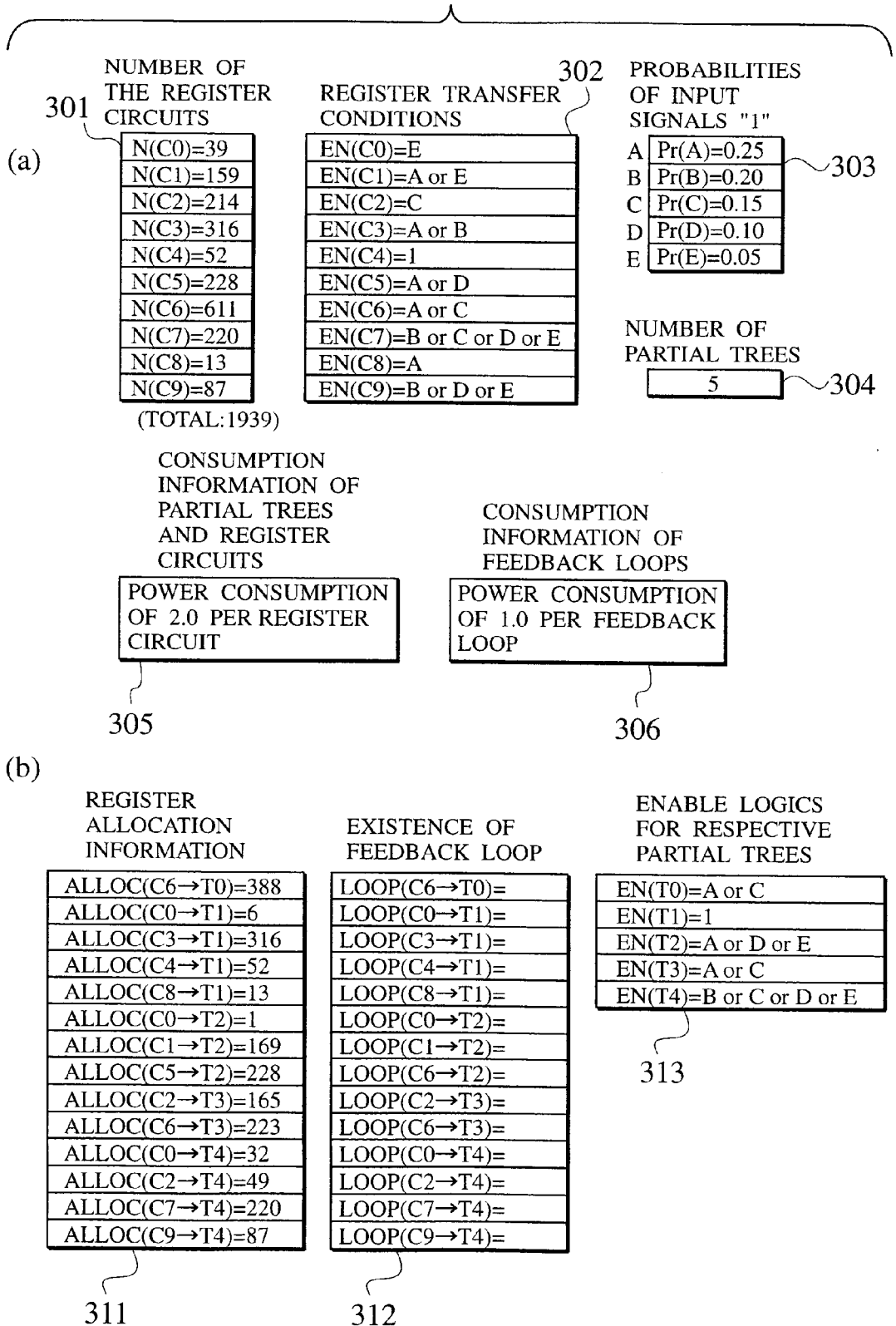
FIG. 6(a) is a block diagram showing information of the clock tree structure without gating logics as illustrated in FIG. 5.
FIG. 6(b) is a block diagram showing information of the clock tree structure with gating logics as illustrated in FIG. 5.

The clock tree structure information 100 without gating logics is composed, for example, of the number 301 of the register circuits for the respective clusters, the register transfer conditions 302 for the respective clusters, the probabilities 303 that the respective signals used for constituting the register transfer conditions are equal to "1", the number 304 of the partial trees, the electric power consumption information 305 of the partial trees and the register circuits not including the feedback loops, and the electric power consumption information 306 of the feedback loops as illustrated in FIG. 6(a). The clock tree structure information 100 is input to the computer aided design system for clock gated logic circuits. The clock tree structure is stored in a circuit information storing section such as a hard disk.

The clock tree structure information 200 with gating logics is composed, for example, of register allocation information 311 for allocating the register circuits of each cluster to the respective partial trees, information 312 indicating the existence of the feedback loop for each the register circuit, and the enable logics 313 for the respective partial trees. The clock tree structure information 200 is output from the computer aided design system for clock gated logic circuits.

Figure 7:
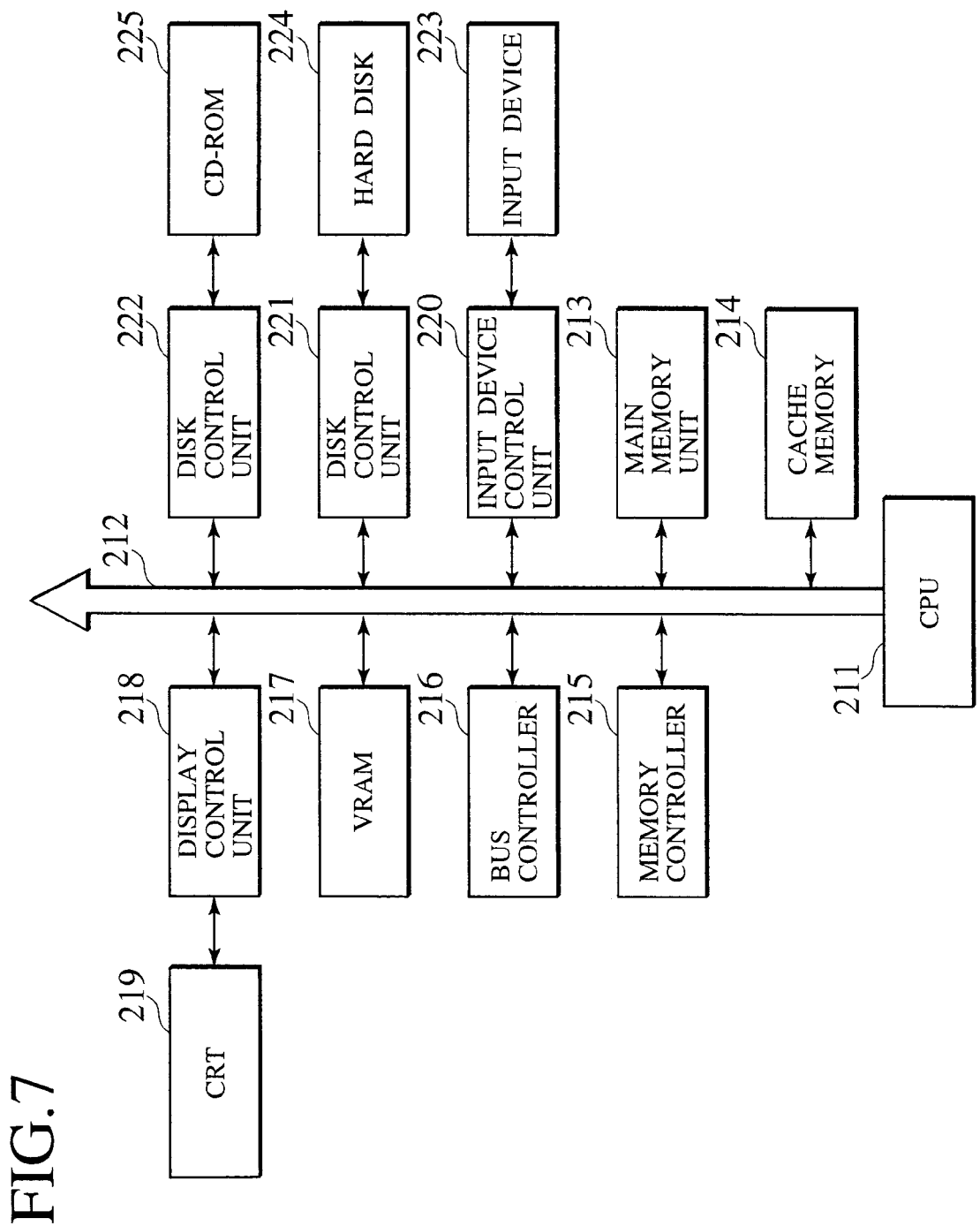
FIG. 7 is the block diagram showing the configuration of a computer for implementing the computer aided design system for clock gated logic circuits as illustrated in FIG. 5.

FIG. 7 is the block diagram showing the configuration of a computer for implementing the computer aided design system for clock gated logic circuits as illustrated in FIG. 5. In the figure, the numeral 211 designates a CPU for executing a computer aided design program for clock gated logic circuits in accordance with the present invention. The CPU 211 is connected to a main memory unit 213, a cache memory 214, a memory controller 215, a bus controller 216, a VRAM 217, a display control unit 218, an input device control unit 220 and a disk control unit 221 and 222 through bus 212. The main memory unit 213 comprises a DRAM or an SRAM and functions as a memory for temporarily storing data such as the computer aided design program for clock gated logic circuits and computation result of the program and other necessary data. The cash memory 214 is the high speed memory that exists between the CPU 211 and the main memory unit 213 on the memory architecture and temporarily hold part of the data on the main memory unit 213 and substitute for the main memory unit 213. The memory controller 215 is provided to control the data exchange between the main memory unit 213 or the cash memory 214 and the CPU 211. The bus controller 216 is provided to control the data exchange between the CPU 211 and the bus 212. The VRAM 217 is a video RAM for latching image data to be displayed in CRT 219.

The display control unit 218 is composed of a graphic processor for controlling the display operation in accordance with image data in the VRAM 217 on the CRT 219. The input device control unit 220 is provided to control input devices 223 of a keyboard and a mouse etc. while the disk control units 221 and 222 are provided to control external storages such as a hard disk 224, a CD-ROM 225 and so on. Furthermore, the input section 2 is accomplished with the input device 223. Also written in the CD-ROM 225 is the computer aided design program for clock gated logic circuits in accordance with the present invention. The respective functions of the input section 2, the storage section 3, the output section 4, the control section 5, the register allocation section 6 and the electric power consumption calculating section 7, as illustrated in FIG. 5, are enabled by loading and executing the computer aided design program for clock gated logic circuits in the CPU 211. Accordingly, in this case, the CD-ROM 225 constitutes an embodiment of the present invention as a possible record medium storing the computer aided design program for clock gated logic circuits of the present invention.

Figure 8:
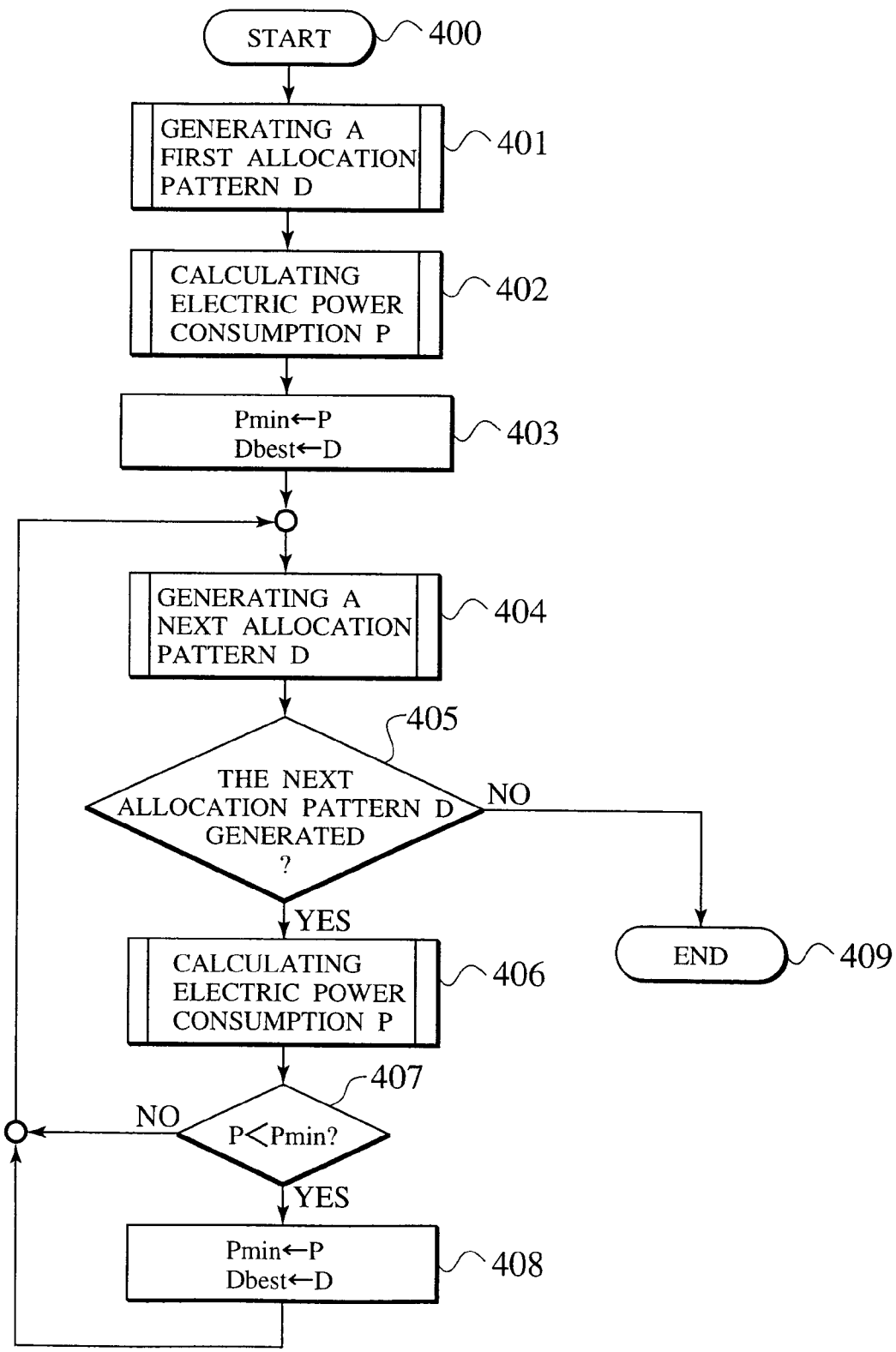
FIG. 8 is a flowchart showing the procedure of the operation of the control section as illustrated in FIG. 5.

In the following explanation, the detailed operation of the structural elements of the computer aided design system for clock gated logic circuits in accordance with this embodiment of the present invention will be explained. FIG. 8 is a flowchart showing the operation of the control section 5. Namely, in the step 401, the control section 5 serves to generate one allocation pattern D for allocating the register circuits of each cluster to the respective partial trees T0 to T4 by means of the register allocation section 6. Next, in the step 402, the control section 5 serves to calculate the electric power consumption P as estimated of the computer aided design system for clock gated logic circuits by means of the electric power consumption calculating section 7. In the step 403, the control section 5 then serves to save the allocation pattern D and the electric power consumption P as estimated as the best allocation pattern Dbest and the minimum electric power consumption value Pmin.

In the step 404, the control section 5 serves to generate a subsequent allocation pattern D again for allocating the register circuits of each cluster to the respective partial trees T0 to T4 by means of the register allocation section 6. However, if it is judged in the step 405 that any new pattern can not be generated, the procedure is terminated in the step 409. When a new allocation pattern D can be generated, the control section 5 serves to calculate the electric power consumption P as estimated of the new allocation pattern D by means of the electric power consumption calculating section 7 in the step 406. If it is judged in the step 407 that the electric power consumption P as estimated is equal or greater than the current minimum electric power consumption value Pmin, the procedure is returned to in the step 404.

If it is judged in the step 407 that the electric power consumption P as estimated is smaller than the current minimum electric power consumption value Pmin, the control section 5 serves to save the instant allocation pattern D and the instant electric power consumption P as estimated as the updated best allocation pattern Dbest and the updated minimum electric power consumption value Pmin in the step 408, followed by returning to the step 404. The steps 404 to 408 are repeated until it is judged in the step 405 that any new pattern can not be generated.

Figure 9:
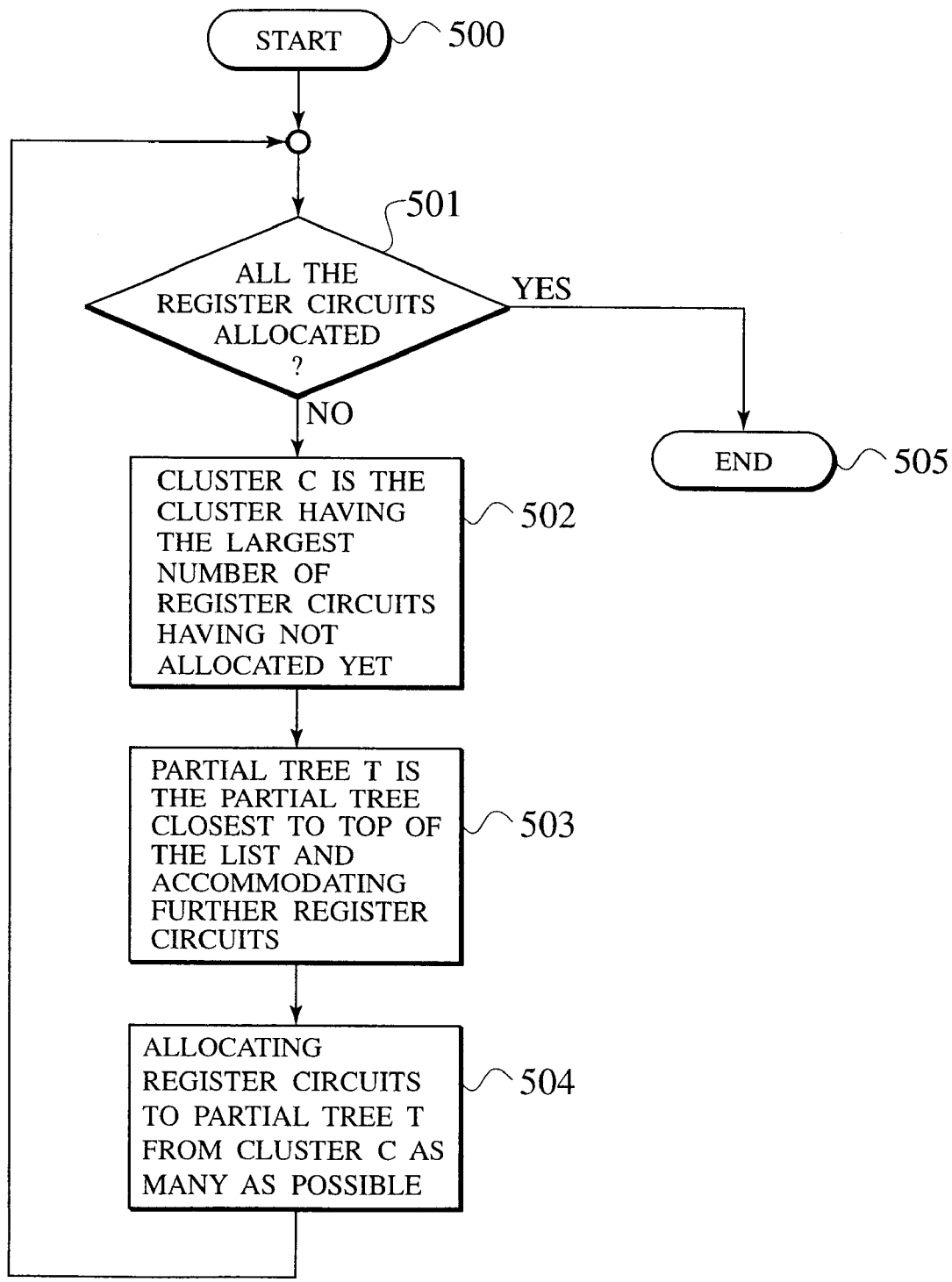
FIG. 9 is a flowchart showing the procedure of obtaining the first allocation pattern by means of the register allocation section as illustrated in FIG. 5.

FIG. 9 is a flowchart showing the procedure of obtaining the first allocation pattern by means of the register allocation section 6. Also, FIG. 10(*a*) through FIG. 10(*o*) are tables illustrating the sequence of obtaining the first allocation pattern by means of the register allocation section 6.

The FREE fields in the figure are provided for storing the number of the register circuits belonging to each cluster and having not been allocated to any partial tree yet. In the initial state, the numbers 39, 159, . . . 87 of all the register circuits belonging to the respective cluster C0, C1, . . . C9 are written to the FREE fields. The T0 field through the T1 field are provided for storing the numbers of the register circuits belonging to each cluster and having been allocated to the partial trees respectively.

In the initial state, the T0 field through the T1 field are initialized to "0" as indicated by blank in the figure. The ALL0C fields are provided for storing the history of the register allocation. For each time of allocating the register circuits, the cluster, the partial tree and the number of the allocated register circuits as handled are recorded in the ALL0C field as one item of allocation information while for each time of undoing the allocation of the register circuits, one item of allocation information is removed. In the initial state, there is no item of allocation information as recorded as illustrated in FIG. 10(*a*).

The register allocation section 6 serves to judge whether or not all the register circuits have been allocated to the partial trees in the step 501. When all the register circuits have completely been allocated to the partial trees, all the FREE fields have been filled with "0". However, since there are stored valid items other than "0" in the FREE fields indicative of the register circuits having not been allocated yet in the case as illustrated in FIG. 10(*a*), the procedure is advanced to the step 502.

The register allocation section 6 then serves to determine one of the clusters which has the largest number of the register circuits having not been allocated yet in the step 502. Such a cluster is called the cluster C hereinbelow. At the present, the cluster C6 has the largest number 611 of the register circuits having not been allocated so that the cluster C6 becomes the cluster C. It is effective to allocate the register groups belonging to one cluster are allocated to the same partial tree as many as possible. For this reason, the priority is given to the clusters which has the largest number of the register circuits having not been allocated yet.

If the number of the clusters each of which is separated and allocated to different partial trees is increased, the respective one of the partial trees tends to have the register circuits of a larger number of the clusters. The enable logic of the respective partial tree is the logic sum of the respective register transfer conditions of the register groups belonging to that partial tree. The probability that the enable logic is satisfied is therefore increased as the number of the clusters belonging to that partial tree is increased, so that the clock gating technique is less effective to reduce the electric power consumption. Accordingly, there is an optimal number of the partial trees. In this case, five partial trees are provided.

The register allocation section 6 serves to determine a partial tree which is closest to the top of a list among from the partial trees to which register circuits can be allocated in the step 503. Such a partial tree as determined is called the partial tree C hereinbelow. In this case, the list is such as contain a series arrangement of the names of the partial trees in the order of name, i.e., T0, T1, T2, T3 and T4, only for the purpose of determining the order of handling the partial trees.

Also, the total number 1939 of the register circuits belonging to the ten the clusters C0 to C9 have to be allocated to the partial trees T0 to T4 in a uniform manner so that about 388 (≈1939/5) register circuits will be allocated to each partial tree. The smaller the disparity in the numbers of the register circuits allocated to partial tree, the narrower the skew the clock signal is transferred to the respective register circuits with. It has been confirmed by experiments that the skew is sufficiently small if the disparity in the numbers of the register circuits is no higher than 5%. When the number of the register. circuits is not extremely small, i.e., as in practical cases, the disparity in the numbers of the register circuits is always no higher than 5%.

At the present, all the partial trees T0 to T4 have rooms to which the register circuit can be allocated so that the partial tree T0 located at the top of the list becomes the partial tree T. The register allocation section 6 serves to allocate the register circuits to the partial tree T (=T0) from the cluster C (=C6) as many as possible in the step 504. It will be understood from the FREE fields as illustrated in FIG. 10(*a*) that 611 register circuits belonging to the cluster C6 have not been allocated to any partial tree yet.

On the other hand, while about 388 register circuits are to be allocated to each partial tree, no register circuit is allocated to the partial tree T0 so that it is possible to allocate 388 register circuits to the partial tree T0. Accordingly, 388 register circuits are allocated to the partial tree T0 among from the 611 register circuits belonging to the cluster C6. The result of the allocation is illustrated in FIG. 10(*b*).

The register allocation section 6 then confirm that there are the register circuits having not been allocated to the partial trees in the step 501. The procedure is therefore advanced to the step 502.

In the step 502, the register allocation section 6 serves to determine the cluster C3 which has 316 register circuits not allocated yet which is the largest number of the register circuits not allocated yet among all the clusters. The cluster C3 therefore becomes the cluster C.

At the present in the step 503, the partial trees T1 to T4 have rooms to which the register circuit are allocated so that the partial tree T1 located closest to the top of the list becomes the partial tree T. The register allocation section 6 serves to allocate the register circuits to the partial tree T (=T1) from the cluster C (=C) as many as possible in the step 504. While the cluster C3 has 316 register circuits not allocated yet, since the partial tree T1 has a room accommodating 388 register circuits, all the 316 register circuits are allocated to the partial tree T1 from the cluster C3. The result of the allocation is illustrated in FIG. 10(c).

Thereafter, the initial allocation pattern is sequentially constructed in the same manner as illustrated in FIG. 10(d) to FIG. 10(j), respectively each time the step 501 through the step 504 are conducted. When the step 501 through the step 504 are repeated for 14 times, the initial allocation pattern is completed as illustrated in FIG. 10(o).

Since all the FREE fields have been filled with "0" in this case, the branch condition is satisfied in the step 501 so that the register allocation section 6 finishes the initial generation of the allocation pattern in the step 505.

Figure 11:
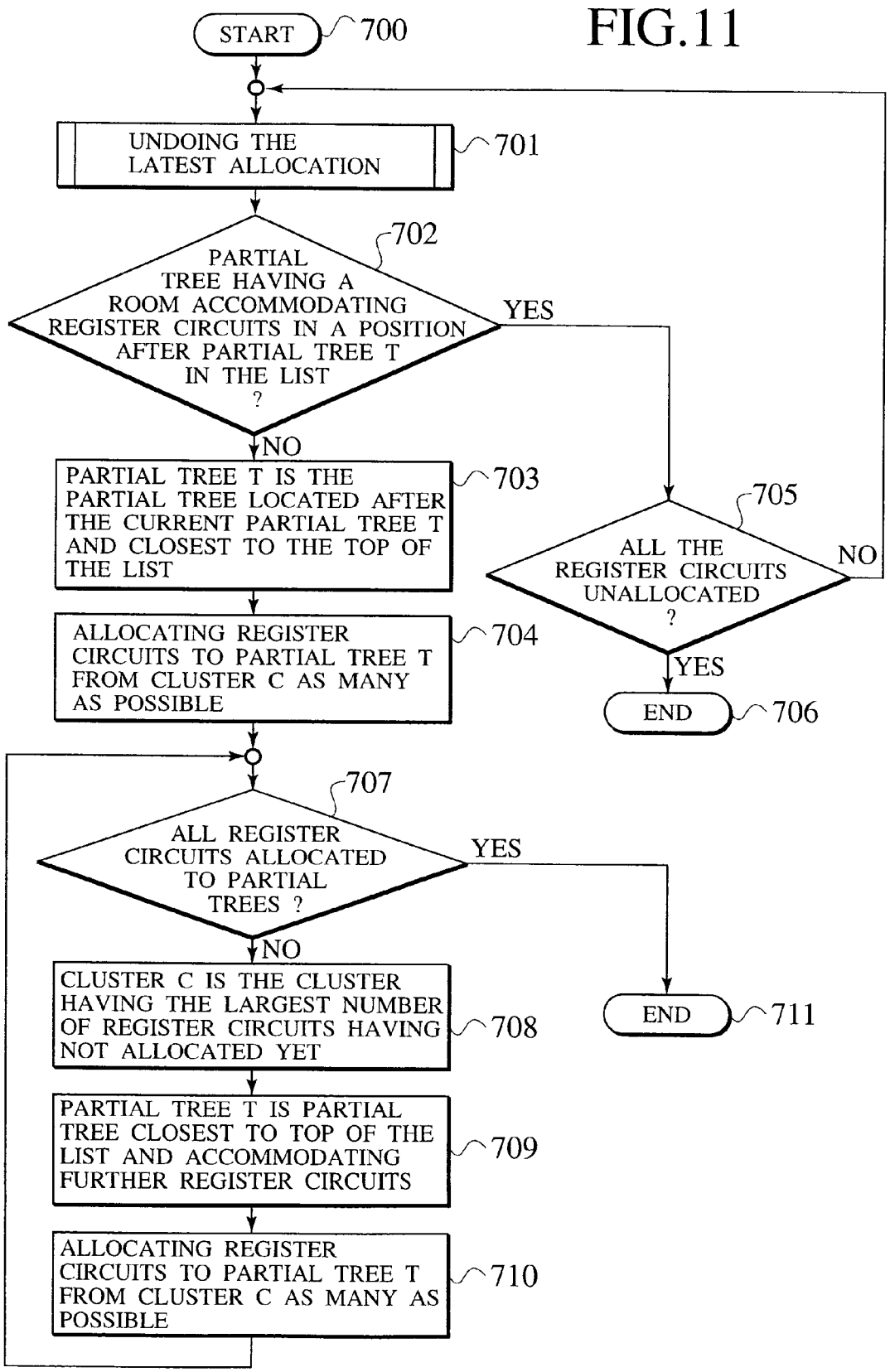
FIG. 11 is a flowchart showing the procedure for obtaining a subsequent allocation pattern by means of the register allocation section as illustrated in FIG. 5.

FIG. 11 is a flowchart showing the procedure for obtaining a subsequent allocation pattern by means of the register allocation section 6. Also, FIG. 12(a) through FIG. 12(o) are tables illustrating the sequence of obtaining the subsequent allocation pattern by means of the register allocation section 6.

Assuming the currently allocation pattern is as illustrated in FIG. 12(a), it is explained how to construct the subsequent allocation pattern by means of the register allocation section 6. The register allocation section 6 serves to undo the latest allocation (one cluster to one partial tree) in the step 701. Such a cluster related to the latest allocation is called the cluster C while such a partial tree related to the latest allocation is called the partial tree T hereinbelow. Namely, the latest allocation is performed as 13 register circuits of the cluster C8 are allocated to the partial tree T4 so that the cluster C8 becomes the cluster C while the partial tree T4 becomes the partial tree T. If undoing the latest allocation, the state is transferred from FIG. 12(a) to FIG. 12(b).

The register allocation section 6 then serves to judge whether or not there is a partial tree having a room accommodating register circuits in a position after the partial tree T (=T4) in the list in the step 702. Since there is no partial tree having a room except for the partial tree T4, the procedure advances to the step 705.

In the step 705, the register allocation section 6 serves to judge whether or not the allocation of all the register circuits to the partial trees T0 to T4 is undone in the step 705. The ALLOC fields as illustrated in FIG. 12(b) contain 13 records of the allocation of the register circuits and therefore the procedure is returned to the step 701 after the judgment.

The register allocation section 6 then serves to undo the latest allocation in the step 701 again. Namely, in this case, the latest allocation is the 13th record in the ALLOC fields which is performed as 39 register circuits of the cluster C0 are allocated to the partial tree T4 so that the cluster C0 becomes the cluster C while the partial tree T4 becomes the partial tree T. If undoing this latest allocation, the state is transferred from FIG. 12(b) to FIG. 12(c).

Also in this case, since there is no partial tree having a room except for the partial tree T4 and the allocation of all the register circuits to the partial trees T0 to T4 has not been undone yet, the steps 702, 705 and 701 are repeated by means of the register allocation section 6 in order that the allocation of the register circuits corresponding to the twelfth through the eighth records are undone in sequence. The unallocation of the register circuits is therefore performed as illustrated in FIG. 12(d) through FIG. 12(h). After undoing the eighth allocation record, the cluster C5 becomes the cluster C while the partial tree T3 becomes the partial tree T.

When the register allocation section 6 judges, under the condition as illustrated in FIG. 12(h), whether or not there is a partial tree having a room accommodating register circuits in a position located after the partial tree T (=T3) in the step 702, the procedure is advanced to the step 703 since the register circuits can be allocated to the partial tree T4.

The register allocation section 6 then select the partial tree T4 to be the new partial tree T (=T4), which is located after the current partial tree T (=T3) and closest to the top of the list, among from the partial trees (T3 and T4) accommodating register circuits The register allocation section 6 serves to allocate the register circuits to the partial tree T (=T4) from the cluster C (=C5) as many as possible in the step 704. It will be understood from the FREE fields as illustrated in FIG. 12(h) that 156 register circuits belonging to the cluster C5 have not been allocated to any partial tree yet.

On the other hand, there is no register circuit is allocated to the partial tree T4 which can be therefore accommodating 388 register circuits. Accordingly, all the 156 register circuits are allocated from the cluster C5 to the partial tree T4 by means of the register allocation section 6. The result of the allocation is illustrated in FIG. 12(i).

The register allocation section 6 then judges whether or not all the register circuits have been allocated to the partial trees in the step 707, and thereafter the procedure is advanced to the step 708 since some FREE field has not been filled with "0" yet.

Next, in the step 708, the register allocation section 6 serves to determine the cluster having the maximum number of the register circuits which have not been allocated to any partial tree yet. Such a cluster becomes the cluster C. At this time, as illustrated in FIG. 12(i), the maximum number of the register circuits are those of the cluster C9, i.e., 87 register circuits. Then, the cluster C9 becomes the cluster C. Next, in the step 709, the new partial tree T is determined as is closest to the top of a list among from the partial trees to which register circuits can be allocated. At this time, the partial trees T3 and T4 have rooms to which the register circuit are allocated so that the partial tree T3 located at the top of the list becomes the partial tree T.

The register allocation section 6 serves to allocate the register circuits to the partial tree T (=T3) from the cluster C (=C9) as many as possible in the step 710. There are 87 register circuits having not been allocated yet among from the register circuits belonging to the cluster C9. On the other hand, there are 373 register circuits having already been allocated to the partial tree T3 so that additional 15 (=388−373) register circuits can be allocated thereto. Accordingly, the register allocation section 6 serves to allocate 15 register circuits from the cluster C9 to the partial tree T3. The result of the allocation is illustrated in FIG. 12(j).

Thereafter, the subsequent allocation pattern is sequentially constructed by repeating the step 707 through the step 710 as illustrated in FIG. 12(k) through FIG. 12(o).

When the step 707 is conducted under the condition as illustrated in FIG. 12(o), the procedure is advanced to the step 711 since all the FREE fields have been filled with "0". The register allocation section 6 then finishes the initial generation of the subsequent allocation pattern in the step 711.

When the subsequent allocation has been completed in this manner, the register allocation section 6 serves to repeat the operation of the allocation of the register circuits as illustrated in FIG. 11 for the current allocation pattern in order to generate a new allocation pattern.

Figure 13:
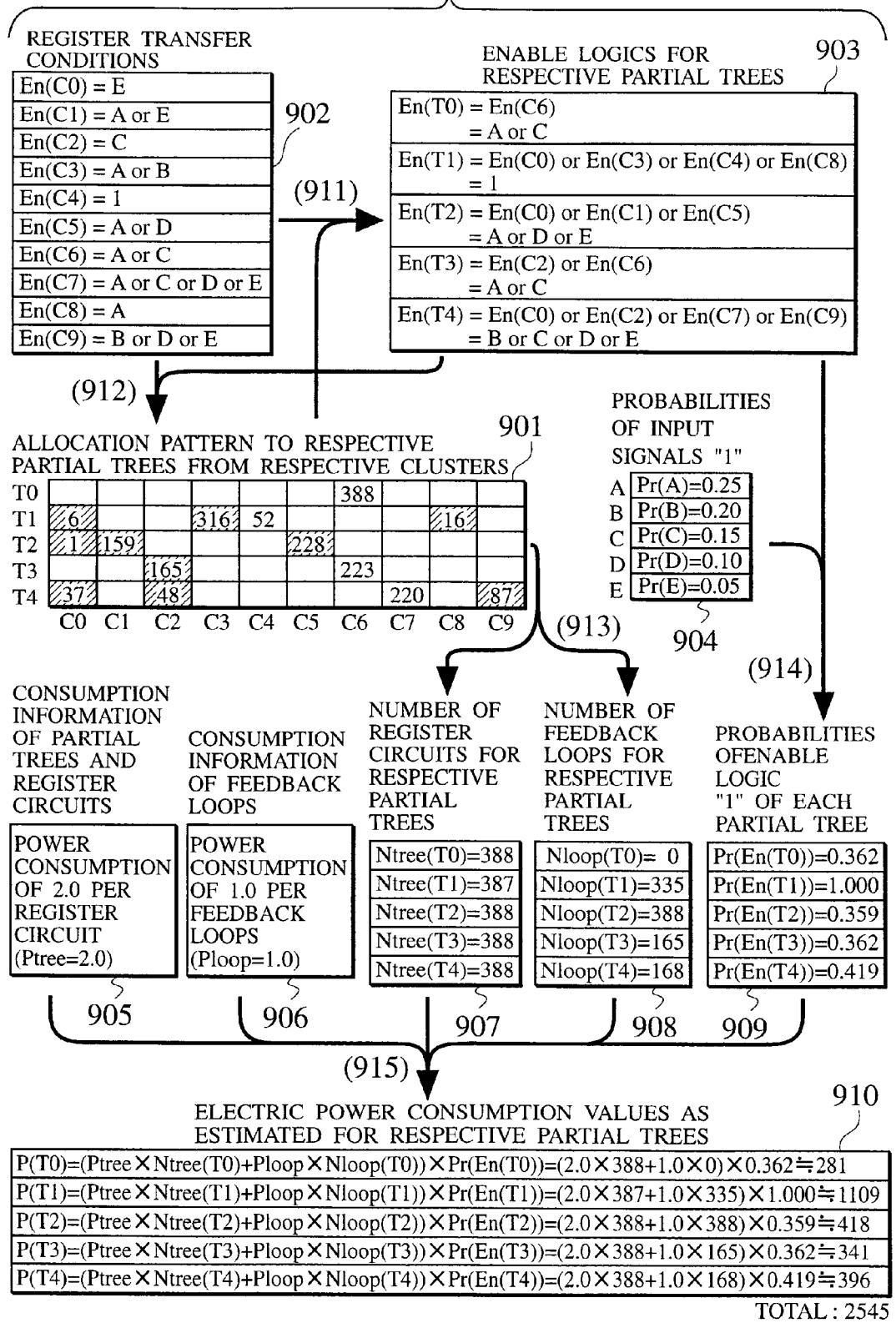
FIG. 13 is a view for explaining the method of calculating the electric power consumption by means of the electric power consumption calculating section as illustrated in FIG. 5.

FIG. 13 is a view for explaining the method of calculating the electric power consumption by means of the electric power consumption calculating section 7. First, one allocation pattern of the register circuits is generated by the register allocation section 6 as described above. The electric power consumption of the clock tree structure (together with the register circuits and the feedback loops) of the allocation pattern 901 is calculated by means of the electric power consumption calculating section 7.

The electric power consumption calculating section 7 serves to receive the register transfer conditions 902 for the respective clusters as well as the allocation pattern 901 and calculate the enable signal 903 on the basis of the data as input in the step 911.

In this example, each register transfer condition 902 is composed of a single input signal or a logic sum of input signals for the sake of clarity in explanation. However, the register transfer condition 902 can consist of any logic equation. The logic sum of the register transfer conditions of the clusters allocated to a partial tree can be calculated as long as a logic equation is given to each cluster as the register transfer condition 902.

The electric power consumption calculating section 7 then serves to determine in the step 912 the register group (hatched entries in the allocation pattern 901) consisting of the register circuits which require feedback loops on the basis of the register transfer conditions 902 for the respective clusters and the enable logics 903 for the respective partial trees. In the case that the register transfer condition of the register circuit belonging to a cluster is different from the enable logic of a partial tree, a feedback loop has to be provided for each of the register circuits which are allocated from that cluster to that partial tree.

The number of the feedback loops 908 for the respective partial trees are calculated in the step 913 as well as the number of the register circuits for the respective partial trees on the basis of the allocation pattern 901.

Also, the probability 909 that the enable logic of each partial tree is equal to "1" is calculated on the basis of the enable logic 903 for each partial tree and the probability 904 that each input signal is equal to "1" (relevant to the register transfer condition) given as input data in the step 914. For example, calculated as follows is the probability Pr(En(T2)) that the enable logic En(T2) of the partial tree T2 is equal to "1".

$$Pr(En(T2)) = Pr(A \text{ or } D \text{ or } E)$$
$$= Pr(A \text{ or } D \text{ or } E/A = 0) \times Pr(A = 0) +$$
$$\quad Pr(A \text{ or } D \text{ or } E/A = 1) \times Pr(A = 1)$$
$$= Pr(D \text{ or } E) \times (1 - Pr(A)) + Pr(1) \times Pr(A)$$
$$= Pr(D \text{ or } E) \times 0.75 + 1.00 \times 0.25$$
$$= (Pr(D \text{ or } E/D = 0) \times Pr(D = 0) + Pr(D \text{ or } E/D = 1) \times$$
$$\quad Pr(D = 1)) \times 0.75 + 0.25$$
$$= (Pr(E) \times (1 - Pr(D)) + Pr(1) \times Pr(D)) \times 0.75 + 0.25$$
$$= (0.05 \times 0.90 + 1.00 \times 0.10) \times 0.75 + 0.25$$
$$= 0.359$$

In the logic equations as described above, the representation such as Pr(E/V=c) is used to indicate the probability that the logic equation E is equal to "1" when the value C is assigned to the variable V which is included in the logic equation E. Also, the representation such as Pr(V=1) is used to indicate the probability that the logic signal V is equal to "1". The electric power consumption calculating section 7 then serves to obtain the electric power consumption values 910 as estimated for the respective partial trees by making use of the number 907 of the register circuits of each partial tree, the number of the feedback loops 908 for the respective partial trees, the probability 909 that the enable logic of each partial tree is equal to "1", the electric power consumption information 906 for the feedback loops as input and the electric power consumption information 905 for the respective partial trees and register circuits as input in the step 915.

The total value of the electric power consumption values 910 is the electric power consumption as estimated for the entirety of the clock tree structure (inclusive of those of the register circuits and the feedback loops).

The electric power consumption as estimated for each of the plurality of the allocation patterns is obtained by means of the electric power consumption calculating section 7 in this manner. The control section serves to select one of the allocation patterns which has the minimum electric power consumption as estimated, which is then output from the output section 4 as the clock tree structure information 200 with gating logics. The gated clock circuit as illustrated in FIG. 3 is an example as designed on the basis of the clock tree structure information 200 with gating logics thus obtained in accordance with the present invention.

In accordance with the embodiment of the present invention, it is possible to realize a computer aided design system for quickly designing a clock gated logic circuit having the partial trees T0 to T4 whose sizes (i.e., the number of the register circuits) are designed equal to each other resulting in decreased clock skew. Accordingly, it is possible to finish the designing and developing process of a gated clock circuit whose electric power consumption is small in a short time without troubles and within the schedule.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

What is claimed is:

1. A gated clock system comprising:

a plurality of storage elements which are grouped into a plurality of partial trees;

a plurality of gating circuits provided respectively for said partial trees in order to control a clock signal supplied to each of said partial trees respectively in accordance with a logic sum of enable logics of said storage elements belonging to said partial trees, wherein at least one of said partial trees has at least one of said storage elements having a feedback loop and at least one of said storage elements having no feedback loop, wherein said storage elements are grouped into the plurality of partial trees so that a disparity in a number of said storage elements belonging to said partial trees is not greater than 5%.

2. The system of claim 1, wherein said storage elements comprise register circuits comprising flip-flops.

3. The system of claim 2, wherein said feedback loop comprises a multiplexer for receiving an output signal of said register circuit and an external input signal and outputting one of the output signal of said register circuit and the external input signal as selected in accordance with the enable logic of the grouped storage elements having the feedback loop.

* * * * *